(12) United States Patent
Chen et al.

(10) Patent No.: US 10,243,084 B2
(45) Date of Patent: Mar. 26, 2019

(54) METHOD FOR FABRICATING A FLASH MEMORY

(71) Applicant: UNITED MICROELECTRONICS CORP., Hsin-Chu (TW)

(72) Inventors: Chih-Jung Chen, Hsinchu County (TW); Tzu-Ping Chen, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/279,410

(22) Filed: Sep. 28, 2016

(65) Prior Publication Data

US 2017/0018649 A1    Jan. 19, 2017

Related U.S. Application Data

(62) Division of application No. 14/489,439, filed on Sep. 17, 2014, now Pat. No. 9,490,016.

(30) Foreign Application Priority Data

Aug. 13, 2014 (CN) .......................... 2014 1 0395988

(51) Int. Cl.
*H01L 29/788* (2006.01)
*H01L 29/66* (2006.01)
*H01L 21/28* (2006.01)
*G11C 16/04* (2006.01)
*G11C 16/10* (2006.01)
(Continued)

(52) U.S. Cl.
CPC ...... *H01L 29/7887* (2013.01); *G11C 16/0408* (2013.01); *G11C 16/0416* (2013.01); *G11C 16/0466* (2013.01); *G11C 16/10* (2013.01); *G11C 16/14* (2013.01); *H01L 21/28273* (2013.01); *H01L 21/28282* (2013.01); *H01L 27/11524* (2013.01); *H01L 29/42328* (2013.01);
(Continued)

(58) Field of Classification Search
CPC ......... H01L 21/28273; H01L 21/28282; H01L 29/42328; H01L 29/66825; H01L 29/7881; H01L 29/7841; H01L 29/6653; H01L 29/66545; H01L 29/66553; H01L 29/6656; H01L 29/66583; H01L 29/401; H01L 29/515; H01L 29/518; H01L 29/42368; H01L 27/11524; G11C 16/0408; G11C 16/0416; G11C 16/0466; G11C 16/10; G11C 16/14
See application file for complete search history.

(56) References Cited

U.S. PATENT DOCUMENTS 5,273,923 A    12/1993 Chang
5,877,523 A    3/1999 Liang et al.
(Continued)

*Primary Examiner* — Brigitte A Paterson
(74) *Attorney, Agent, or Firm* — Winston Hsu

(57) ABSTRACT

A method for fabricating semiconductor device is disclosed. First, a substrate is provided, and a dielectric stack is formed on the substrate, in which the dielectric stack includes a first silicon oxide layer and a first silicon nitride layer. Next, the dielectric stack is patterned, part of the first silicon nitride layer is removed to form two recesses under two ends of the first silicon nitride layer, second silicon oxide layers are formed in the two recesses, a spacer is formed on the second silicon oxide layers, and third silicon oxide layers are formed adjacent to the second silicon oxide layers.

9 Claims, 4 Drawing Sheets

(51) Int. Cl.
*G11C 16/14* (2006.01)
*H01L 27/11524* (2017.01)
*H01L 29/423* (2006.01)

(52) U.S. Cl.
CPC .... *H01L 29/66825* (2013.01); *H01L 29/7881* (2013.01)

(56) References Cited

U.S. PATENT DOCUMENTS

| | | | |
|---|---|---|---|
| 5,960,285 | A | 9/1999 | Hong |
| 5,972,752 | A | 10/1999 | Hong |
| 7,154,143 | B2 | 12/2006 | Jung |
| 7,238,572 | B2 | 7/2007 | Jeon |
| 7,242,612 | B2 | 7/2007 | Jung |
| 7,408,219 | B2 | 8/2008 | Yu |
| 2002/0009867 | A1* | 1/2002 | Numazawa ........ H01L 21/28185 438/589 |
| 2007/0047303 | A1 | 3/2007 | Kim |
| 2007/0145472 | A1 | 6/2007 | Kwak |
| 2008/0061359 | A1* | 3/2008 | Lee ................... H01L 21/28273 257/324 |
| 2008/0248620 | A1* | 10/2008 | Liu ................... H01L 21/28273 438/257 |
| 2008/0315290 | A1* | 12/2008 | Lee ................... H01L 21/28282 257/321 |
| 2009/0039405 | A1* | 2/2009 | Cheng ............... H01L 21/28273 257/311 |
| 2014/0097481 | A1* | 4/2014 | La Rosa ............... H01L 29/788 257/315 |

\* cited by examiner

METHOD FOR FABRICATING A FLASH MEMORY

CROSS REFERENCE TO RELATED APPLICATIONS

This application is a division of U.S. application Ser. No. 14/489,439 filed Sep. 17, 2014, and incorporated herein by reference in its entirety.

BACKGROUND OF THE INVENTION

1. Field of the Invention

The invention relates to a method for fabricating a flash memory, and more particularly, to a method of fabricating a flash memory having two tunnel oxide layers between floating gate and substrate.

2. Description of the Prior Art

A flash memory is a type of non-volatile memory, which can preserve data within the memory even when an external power supply is off. Recently, because flash memories are electrically re-writable and electrically re-erasable, they have been widely applied in the fabrication of electrical products, such as mobile phones, digital cameras, video players, personal digital assistants (PDA) or systems on a chip (SOC).

However, conventional flash memory typically uses a single tunnel oxide layer to carry out programming and erase operations, which not only affects the operation speed of the entire memory cell but also decreases endurance and life expectancy of the device. Hence, how to alter the architecture and operation means of current flash memory thereby improving the endurance of the device has become an important task in this field.

SUMMARY OF THE INVENTION

A semiconductor device is disclosed. The semiconductor device includes: a substrate; a floating gate on the substrate; a first silicon oxide layer between the floating gate and the substrate; a first tunnel oxide layer and a second tunnel oxide layer adjacent to two sides of the first silicon oxide layer; and a control gate on the floating gate. Preferably, the thickness of the first tunnel oxide layer and the second tunnel oxide layer is less than the thickness of the first silicon oxide layer.

According to another aspect of the present invention, a method for operating memory cell is disclosed, in which the memory cell includes a floating gate on a substrate, a patterned oxide-nitride-oxide (ONO) stack on the floating gate, a control gate on the ONO stack, a first tunnel oxide layer and a second tunnel oxide layer between the floating gate and the substrate, a select gate adjacent to the first tunnel oxide layer, a drain region adjacent to the select gate, and a source region adjacent to the second tunnel oxide layer. The method preferably includes the steps of: during a program operation further comprises: applying a first voltage to the drain region; applying a second voltage to the select gate, wherein the second voltage being higher than the first voltage; and applying zero voltage to the control gate so that electrons are stored from the first tunnel oxide layer to the floating gate; and during an erase operation further comprises: applying zero voltage to the select gate while the drain region remains floating; and applying a third voltage to the control gate so that electrons are released from the second tunnel oxide layer.

According to another aspect of the present invention, a method for fabricating semiconductor device is disclosed. The method includes the steps of: providing a substrate; forming a dielectric stack on the substrate, wherein the dielectric stack comprises a first silicon oxide layer and a first silicon nitride layer; patterning the dielectric stack; removing part of the first silicon nitride layer for forming two recesses under two ends of the first silicon nitride layer; forming a plurality of second silicon oxide layers in the two recesses; forming a spacer on the second silicon oxide layers; and forming a plurality of third silicon oxide layers adjacent to the second silicon oxide layers.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
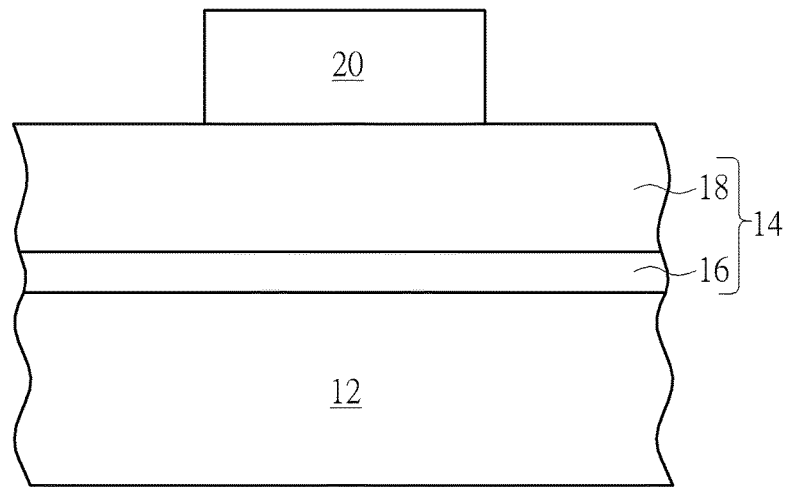
FIGS. 1-7 illustrate a method for fabricating semiconductor device according to a preferred embodiment of the present invention.

Referring to FIGS. 1-7, FIGS. 1-7 illustrate a method for fabricating semiconductor device according to a preferred embodiment of the present invention. As shown in FIG. 1, a substrate 12, such as a substrate composed of silicon, GaAs, silicon-on-insulator (SOI) layer, epitaxial layer, silicon germanium layer, or other semiconductor material is provided, and a dielectric stack 14 is formed on the substrate 12. In this embodiment, the dielectric stack 14 preferably includes a silicon oxide layer 16 and a silicon nitride layer 18 disposed on the silicon oxide layer 16, and an optional tetraethylorthosilicate (TEOS) layer (not shown) could be formed on the silicon nitride layer 18 thereafter.

Figure 2:
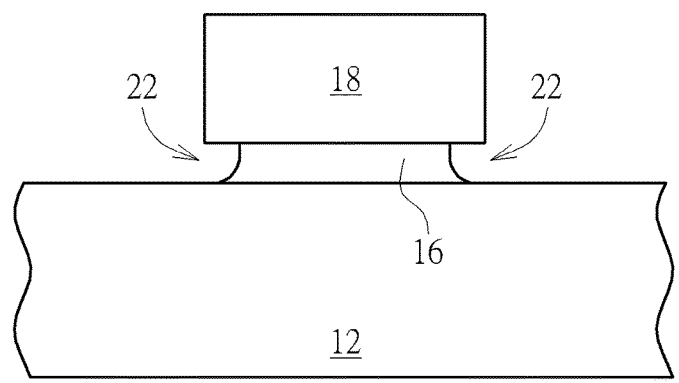

Next, a patterned resist 20 is formed on the dielectric stack 14, and an etching process is conducted to form undercut in the bottom of the silicon nitride layer 18. For instance, as shown in FIG. 2, an etching process is conducted by using the patterned resist 20 as mask to remove part of the silicon nitride layer 18 without removing any of the silicon oxide layer 16. Next, a dry etching process is conducted to remove the silicon oxide layer 16 not covered by the silicon nitride layer 18 so that the edges of the silicon oxide layer 16 are substantially aligned with the edges of the silicon nitride layer 18. A wet etching process is conducted thereafter to remove part of the silicon oxide layer 16 under the silicon nitride layer 18 for forming two recesses 22 directly under two ends of the silicon nitride layer 18. The patterned resist 20 is stripped thereafter.

Figure 3:
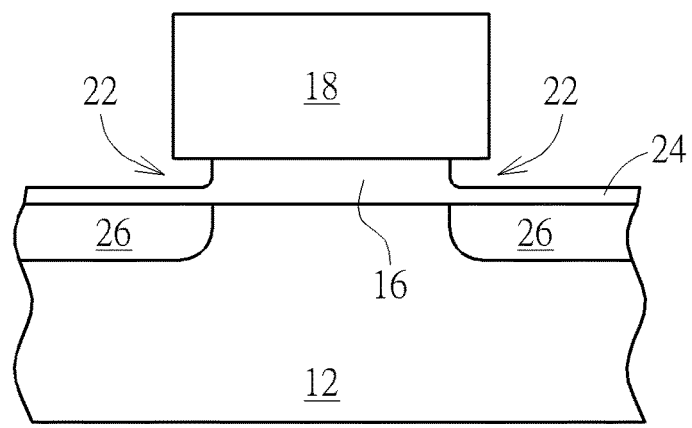

Next, as shown in FIG. 3, an oxidation process is conducted to form a plurality of silicon oxide layers 24 in the two recesses 22, and an n-type implantation process is carried out to form a buried n+ region 26 in the substrate 12. Preferably, the thickness of the silicon oxide layers 24 is lower than the thickness of the previous silicon oxide layer 16.

Figure 4:
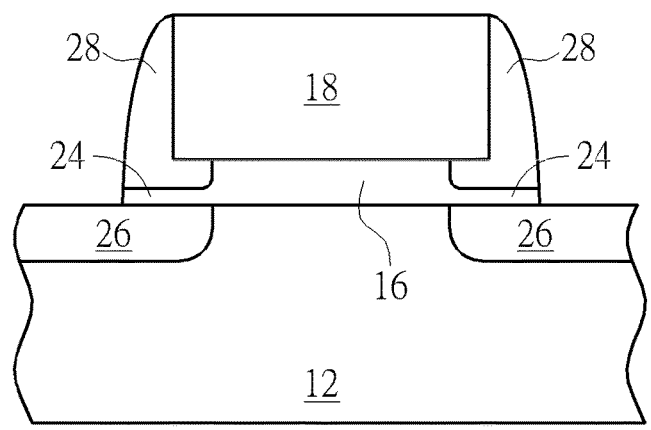

Next, as shown in FIG. 4, another silicon nitride layer (not shown) is formed on the substrate 12, the silicon oxide layers 24, and the silicon nitride layer 18, and part of the silicon nitride layer is removed to form a spacer 28 on the silicon oxide layers 24. In this embodiment, as part of the silicon nitride layer is inserted into the two recesses 22 formed previously, the spacer 28 when viewed from left side or right side preferably includes an L-shape and a reverse L-shape.

Figure 5:
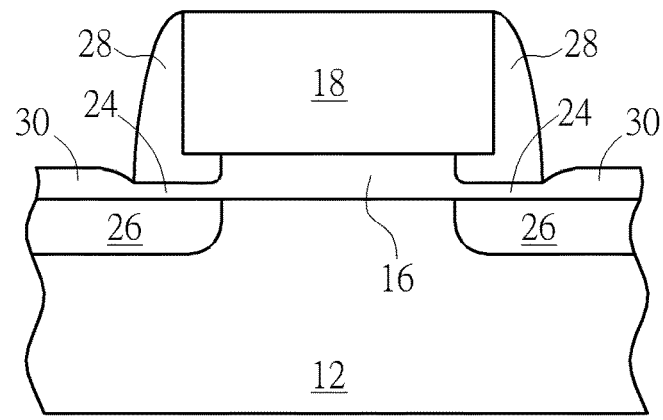

Next, as shown in FIG. 5, another oxidation process is conducted to forma plurality of silicon oxide layers 30 adjacent to the silicon oxide layers 24, in which the thickness of the silicon oxide layers 30 is greater than the thickness of the silicon oxide layers 24.

Figure 6:
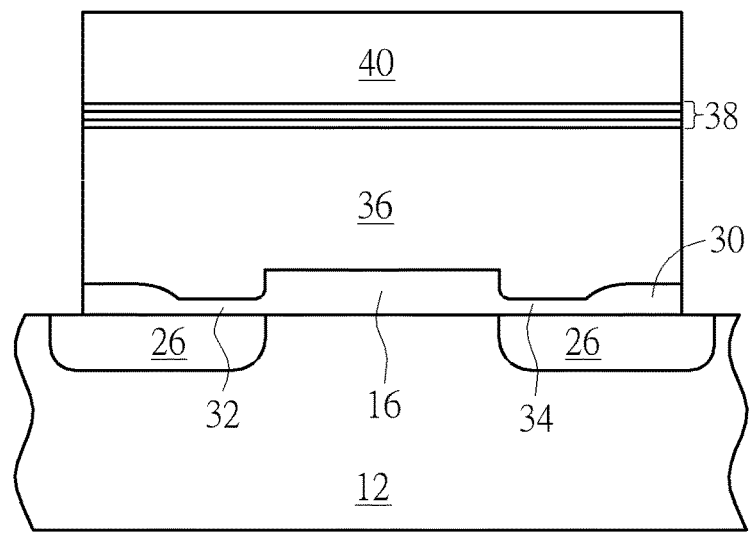

Next, as shown in FIG. 6, after the silicon nitride layer 18 and the spacer 28 are removed to expose the silicon oxide layers 16, 24, 30 underneath, the silicon oxide layers 24 are removed, and another oxidation process is conducted to form a first tunnel oxide layer 32 and a second tunnel oxide layer 34 between the silicon oxide layers 30 and silicon oxide layer 16. Since the silicon oxide layers 24 are typically affected by ions injected into the substrate 12 during formation of the buried n+ region 26, it would be desirable to conduct another oxidation process to form new oxide layers serving as tunnel oxide layers so that the quality of electron movement during operation of memory device is ensured.

Next, a first gate layer (not shown) is covered on the first tunnel oxide layer 32, the second tunnel oxide layer 34, the silicon oxide layers 30, and the silicon oxide layer 16, an oxide-nitride-oxide (ONO) stack (not shown) is formed on the first gate layer, and a second gate layer (not shown) is formed on the ONO stack. The second gate layer, ONO stack, and first gate layer are then patterned to form a floating gate 36 on the first tunnel oxide layer 32, the second tunnel oxide layer 34, the silicon oxide layers 30, and silicon oxide layer 16, a patterned ONO stack 38 on the floating gate 36, and a control gate 40 on the ONO stack 38.

Figure 7:
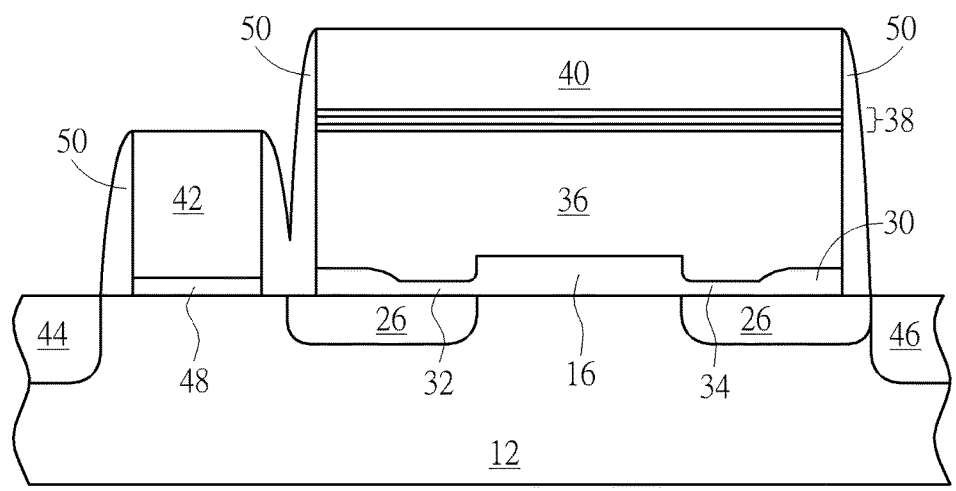

Next, as shown in FIG. 7, after forming a gate oxide layer 48 and a third gate layer (not shown) on the substrate 12, the third gate layer and the gate oxide layer 48 are patterned to form a select gate 42 adjacent to the first tunnel oxide layer 32. Next, a spacer 50 is formed around each gate structure, a drain region 44 is formed adjacent to the select gate 42 and a source region 46 is formed adjacent to the second tunnel oxide layer 34. This completes the fabrication of a flash memory according to a preferred embodiment of the present invention.

Referring again to FIG. 7, which illustrates a structural view of a semiconductor device according to an embodiment of the present invention. Preferably, the semiconductor device includes a substrate 12, a floating gate 36 on the substrate 12, a silicon oxide layer 16 and a plurality of silicon oxide layers 30 between the floating gate 36 and the substrate 12, a first tunnel oxide layer 32 and a second tunnel oxide layer 34 between the silicon oxide layer 16 and silicon oxide layers 30, a control gate 40 on the floating gate 36, a ONO stack 38 between the floating gate 36 and the control gate 40, a select gate 42 adjacent to the first tunnel oxide layer 32, a drain region 44 adjacent to the select gate 42, and a source region 46 adjacent to the second tunnel oxide layer 34. Preferably, the thickness of the first tunnel oxide layer 32 and second tunnel oxide layer 34 is less than the thickness of the silicon oxide layer 16 and silicon oxide layers 30.

According to the aforementioned memory cell structure, a method for operating memory cell is also disclosed according to an embodiment of the present invention. Preferably, the two tunnel oxide layers 32 and 34 are utilized to perform operations such as programming and erasing to improve the overall endurance of the device thereby increasing the performance and life expectancy of the device. For instance, during a program operation, a first voltage, such as 13 volts could be applied to the drain region 44, a second voltage preferably being higher than the first voltage, such as 15 volts is then applied to the select gate 42, and finally zero volts is applied to the control gate 40 so that electrons are stored from the first tunnel oxide layer 32 into the floating gate 36 to complete the program operation. During an erase operation, zero volts could be applied to the select gate 42 while the drain region 44 remains floating, and a third voltage, such as 13 volts is applied to the control gate 40 so that electrons are released from the second tunnel oxide layer 34 to complete the erase operation.

Overall, in contrast to the conventional flash memory of using single tunnel oxide layer to perform programming and erase operations, the present invention preferably forms two individual tunnel oxide layers between floating gate and substrate and uses these two separate tunnel oxide layers to carry out program and erase operations. This not only improves the operation speed of the memory cell, but also increases the endurance and life expectancy of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming a dielectric stack on the substrate, wherein the dielectric stack comprises a first silicon oxide layer and a first silicon nitride layer directly contacting the first silicon oxide layer;
   patterning the dielectric stack;
   removing part of the first silicon oxide layer while simultaneously forming two recesses under two ends of the first silicon nitride layer, wherein the two recesses expose a top surface of the substrate;
   forming second silicon oxide layers in the two recesses, wherein a bottom surface of the second silicon oxide layers is even with a bottom surface of the first silicon oxide layer;
   forming a spacer on the second silicon oxide layers;
   forming third silicon oxide layers adjacent to the second silicon oxide layers;
   removing the first silicon nitride layer and the spacer after forming the third silicon oxide layers;
   removing the second silicon oxide layers; and
   forming a first tunnel oxide layer and a second tunnel oxide layer between the third silicon oxide layers and the first silicon oxide layer.

2. The method of claim 1, further comprising:
   forming a patterned resist on the dielectric stack;
   using the patterned resist as mask to pattern the dielectric stack by removing part of the first silicon nitride layer;
   performing a dry etching process to remove the first silicon oxide layer not covered by the first silicon nitride layer;
   performing a wet etching process to remove part of the silicon oxide layer under the first silicon nitride layer for forming the two recesses under two ends of the first silicon nitride layer; and
   stripping the patterned resist.

3. The method of claim 1, further comprising performing an n-type implantation process after forming the second silicon oxide layers for forming a buried n+ region in the substrate.

4. The method of claim 1, further comprising:
forming a second silicon nitride layer on the substrate, the second silicon oxide layers, and the first silicon nitride layer; and
removing part of the second silicon nitride layer while simultaneously forming the spacer made of the remnants of the second silicon nitride layer on the second silicon oxide layers and in the two recesses.

5. The method of claim 4, wherein the spacer comprises an L-shape and a reverse L-shape.

6. The method of claim 1, wherein the thickness of the third silicon oxide layers is greater than the thickness of the second silicon oxide layers.

7. The method of claim 1, wherein the thickness of the third silicon oxide layers is greater than the thicknesses of the first tunnel oxide layer and the second tunnel oxide layer.

8. The method of claim 1, wherein the thickness of the first silicon oxide layer is greater than the thicknesses of the first tunnel oxide layer and the second tunnel oxide layer.

9. The method of claim 1, further comprising:
forming a floating gate on the first tunnel oxide layer, the second tunnel oxide layer, the third silicon oxide layers, and the first silicon oxide layer, an oxide-nitride-oxide (ONO) stack on the floating gate, and a control gate on the ONO stack;
forming a select gate adjacent to the first tunnel oxide layer; and
forming a drain region adjacent to the select gate and a source region adjacent to the third silicon oxide layers.

* * * * *